United States Patent
Sternchuss et al.

(10) Patent No.: US 9,599,872 B2
(45) Date of Patent: Mar. 21, 2017

(54) ELECTRICALLY CONDUCTIVE SUPPORT FOR A GLAZING UNIT HAVING LIQUID-CRYSTAL-MEDIATED VARIABLE SCATTERING PROPERTIES AND SUCH A GLAZING UNIT

(71) Applicant: Cardinal IG Company, Eden Prairie, MN (US)

(72) Inventors: Juliette Sternchuss, Saint-Germain en Laye (FR); Philippe Letocart, Raeren (BE); Jingwei Zhang, Massy (FR); Matthias Alschinger, Compiegne (FR)

(73) Assignee: Cardinal IG Company, Eden Prairie, MN (US)

( * ) Notice: Subject to any disclaimer, the term of this patent is extended or adjusted under 35 U.S.C. 154(b) by 123 days.

(21) Appl. No.: 14/441,087

(22) PCT Filed: Jul. 30, 2013

(86) PCT No.: PCT/FR2013/051840
§ 371 (c)(1),
(2) Date: May 6, 2015

(87) PCT Pub. No.: WO2014/072596
PCT Pub. Date: May 15, 2014

(65) Prior Publication Data
US 2015/0286079 A1    Oct. 8, 2015

(30) Foreign Application Priority Data
Nov. 7, 2012    (FR) ...................................... 12 02989

(51) Int. Cl.
*G02F 1/1343*    (2006.01)
*G02F 1/137*    (2006.01)
(Continued)

(52) U.S. Cl.
CPC .......... *G02F 1/137* (2013.01); *C03C 17/3435* (2013.01); *G02F 1/1334* (2013.01); *G02F 1/13439* (2013.01); *H05K 1/092* (2013.01)

(58) Field of Classification Search
None
See application file for complete search history.

(56) References Cited

U.S. PATENT DOCUMENTS

| | | | |
|---|---|---|---|
| 5,408,353 | A | 4/1995 | Nichols et al. |
| 5,686,017 | A | 11/1997 | Kobayashi et al. |

(Continued)

FOREIGN PATENT DOCUMENTS

| | | |
|---|---|---|
| EP | 1653276 A1 | 5/2006 |
| EP | 2128688 A1 | 12/2009 |

(Continued)

OTHER PUBLICATIONS

International Search Report from International Application PCT/FR2013/051840, mailed Nov. 13, 2013, 7 pages.

(Continued)

*Primary Examiner* — Ryan Crockett
(74) *Attorney, Agent, or Firm* — Fredrikson & Byron, P.A.

(57) ABSTRACT

An electrically conductive support for a glazing unit having liquid crystal scattering properties may include a multilayer of thin films. In one example, the thin films include an electrode comprising a TCO film, a silicon-nitride-based first barrier film having a thickness e1 of at least 5 nm, and a silicon-oxide-based second barrier film having a thickness e2 of at least 30 nm. The thickness e1 may be smaller than or equal to e2 and/or smaller than 80 nm. Further, the cumulative thickness of the first and second barrier films may be larger than or equal to 50 nm and smaller than 150 nm.

15 Claims, 1 Drawing Sheet

(51) Int. Cl.
*C03C 17/34* (2006.01)
*G02F 1/1334* (2006.01)
*H05K 1/09* (2006.01)

(56) References Cited

U.S. PATENT DOCUMENTS

| | | |
|---|---|---|
| 5,808,715 A | 9/1998 | Tsai et al. |
| 5,958,290 A | 9/1999 | Coates et al. |
| 6,271,899 B1 | 8/2001 | Lewis et al. |
| 6,295,102 B1 | 9/2001 | Higa et al. |
| 6,429,961 B1 | 8/2002 | Harary et al. |
| 6,661,486 B1 | 12/2003 | Faris et al. |
| 7,342,704 B2 | 3/2008 | Yano |
| 7,525,604 B2 | 4/2009 | Xue |
| 7,755,829 B2 | 7/2010 | Powers et al. |
| 7,837,897 B2 | 11/2010 | Zhang et al. |
| 8,102,478 B2 | 1/2012 | Xue |
| 8,187,682 B2 | 5/2012 | Albrecht et al. |
| 2001/0033400 A1 | 10/2001 | Sutherland et al. |
| 2003/0193709 A1 | 10/2003 | Mallya et al. |
| 2005/0190332 A1* | 9/2005 | Yano ............... B32B 17/10 349/149 |
| 2006/0261335 A1 | 11/2006 | Nakahori et al. |
| 2009/0068455 A1 | 3/2009 | Albrecht et al. |
| 2009/0103027 A1* | 4/2009 | Hughes ............ G02F 1/13476 349/115 |
| 2009/0219603 A1 | 9/2009 | Xue |
| 2009/0290078 A1 | 11/2009 | Yang et al. |
| 2010/0118380 A1 | 5/2010 | Xue |
| 2010/0279125 A1 | 11/2010 | Buyuktanir et al. |
| 2010/0294679 A1 | 11/2010 | Griffiths et al. |
| 2011/0037379 A1* | 2/2011 | Lecamp ............ H01L 51/5265 313/503 |
| 2011/0102730 A1* | 5/2011 | Lee .................. G02F 1/13718 349/175 |
| 2011/0232749 A1* | 9/2011 | Lienhart ............ G02B 1/115 136/256 |
| 2013/0093969 A1 | 4/2013 | Li et al. |
| 2014/0176836 A1* | 6/2014 | Brecht ............ B32B 17/10036 349/16 |

FOREIGN PATENT DOCUMENTS

| | | |
|---|---|---|
| FR | 2939240 A1 | 6/2010 |
| JP | 2012030980 A | 2/2012 |
| WO | 9219695 A2 | 11/1992 |
| WO | 2009083693 A2 | 7/2009 |
| WO | 2012022876 A2 | 2/2012 |
| WO | 2012028823 A1 | 3/2012 |

OTHER PUBLICATIONS

Chen et al., "Electro-Optical Properties of Polymer Stabilized Cholesteric Texture Normal-Mode Light Shutter From Flexible Monomers," ALCOM Tech Report XI, 2000, pp. 223-229.

"Liquid Crystal Glass," retrieved from http://www.glazette.com/Glass-Knowledge-Bank-70/Liquid-Crystal-Glass.html on Oct. 1, 2013, 2 pages.

"Switchable Intelligent Glass—SGG Priva-lite Electrochromatic Glass," Saint Gobain Glass India, retrieved from http://in.saint-gobain-glass.com/b2c/default.asp?nav1=pr&nav2=single%20pane&id=18978 on Oct. 1, 2013, 1 page.

"Transparent Display," Kent Optronics, retrieved from http://kentoptronics.com/transparent.html on Oct. 1, 2013, 1 page.

* cited by examiner

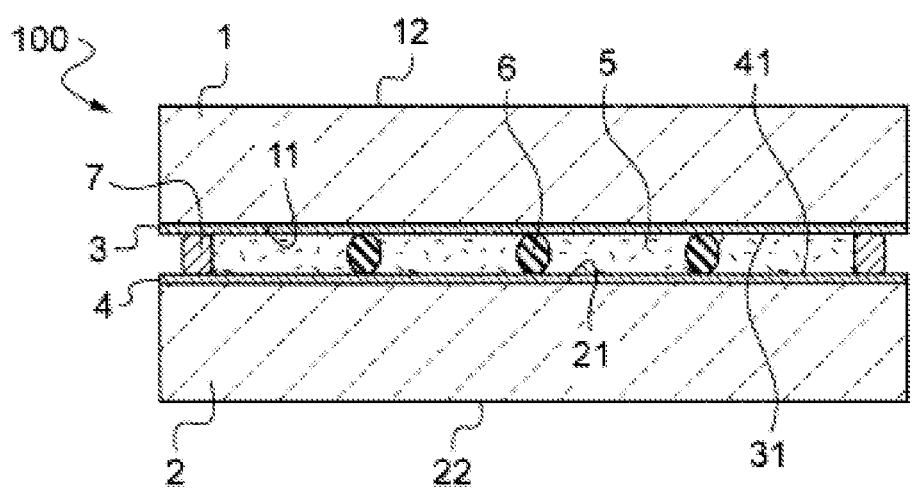

ELECTRICALLY CONDUCTIVE SUPPORT FOR A GLAZING UNIT HAVING LIQUID-CRYSTAL-MEDIATED VARIABLE SCATTERING PROPERTIES AND SUCH A GLAZING UNIT

CROSS-REFERENCE

This application is a 35 U.S.C. 371 national stage filing from International Application No. PCT/FR2013/051840, filed Jul. 30, 2013 and claims priority to France Application No. 1202989 filed Nov. 7, 2012. The entire contents of these applications are incorporated herein by reference.

The invention relates to an electrode for a glazing unit having liquid-crystal-mediated variable scattering properties, equipped with a liquid-crystal layer that alternates reversibly between a transparent state and a non-transparent state, through application of an alternating electric field.

Glazing units are known certain properties of which can be modified under the effect of a suitable supply of electrical power, more particularly the transmittance, absorptance and reflectance at certain wavelengths of electromagnetic radiation, especially in the visible and/or in the infrared, or even light scattering properties, can be modified.

Electrically controllable liquid-crystal-comprising glazing units can be used anywhere, both in the architectural field and in the automotive field, whenever sight through the glazing unit must be prevented at given moments.

The electrodes conventionally used are made of mixed indium tin oxide (ITO). In order to prevent short-circuits being generated by conductive impurities that are greater than or equal in size to the distance between the electrodes, each of the ITO films may be coated with a film made of a dielectric such as $SiO_2$ or $Si_3N_4$, as described in document U.S. Pat. No. 5,808,715.

One object of the invention consists in providing a multiple liquid-crystal-comprising glazing unit that is more reliable and robust, without adversely affecting its optical and electrical properties.

For this purpose, the present invention firstly provides an electrically conductive support for a glazing unit having liquid-crystal-mediated variable scattering properties, comprising a first transparent substrate (made of mineral or organic glass) having a main face comprising a multilayer of thin films, in this order:
  (directly on the main face or on a thin underfilm, for example made of metal oxide or nitride) an electrode comprising a film, called the TCO film, based on a transparent electrically conductive oxide (preferably based on tin and indium) preferably having a thickness $e_0$ lying in a range extending from 50 to 200 nm;
  a silicon-nitride-based first barrier film (based on $SiN_x$ and preferably $Si_3N_4$) that has a thickness $e_1$ of at least 5 nm and that is undoped or optionally doped, preferably with aluminium, and that preferably essentially consists of a silicon nitride, optionally doped, preferably with aluminium; and
  on (preferably directly on) the first barrier film, a silicon-oxide-based second barrier film (based on $SiO_x$ and preferably $SiO_2$) that has a thickness $e_2$ of at least 30 nm, preferably of at least 45 nm or even 50 nm, and even more preferably lower than or equal to 80 nm, and that preferably essentially consists of silicon oxide (silica), this second film being undoped or optionally doped, preferably with aluminium;
  the thickness $e_1$ is smaller than $e_2$, and/or $e_1$ is smaller than 80 nm;

the cumulative thickness $e_b$ of the first and second barrier films is larger than or equal to 50 nm and smaller than or equal to 150 nm, and even more preferably smaller than or equal to 120 nm.

In the present invention the expression "barrier film" is understood to mean a film providing a barrier to short-circuits.

The Applicant has identified a number of sources of short-circuits:
  conductive impurities of greater than or equal size to the distance between the electrodes, as was already known, for example metal particles (Al, stainless steel, etc.) originating from splinters from machines for handling the glass, contaminants of the glass (droplets of tin, etc.) or even contaminants in the polymer/liquid crystal mixtures;
  but also conductive impurities of size smaller than the distance between the electrodes, of the same origin, particularly detrimental if irregularly shaped;
  non-conductive defects with a high dielectric constant since the liquid crystals are then subjected to very high electrical fields; and
  substantial roughness of the TCO film (producing spikes, etc.).

The use of the at least two barrier films according to the invention provides a more effective defence against these multiple sources of short-circuits than all the monolayers of the prior art because:
  the materials of the barrier films, and the minimum values for $e_1$, $e_2$ and $e_b$ are suitably selected; and
  the number of dielectric interfaces is increased, thereby decreasing the number of defects (holes, grain boundaries, pinholes, etc.) passing right through the films on the TCO, which defects could allow short-circuits to form.

These two barrier films have a low dielectric permittivity (typically lower than 10), a high breakdown voltage (typically higher than 4 MV/cm), and a "self-healing" breakdown mode.

For reasons relating to optical adjustment, the ($SiO_x$) second barrier film is chosen to have a lower refractive index (in the visible) than the first barrier film.

The thicknesses $e_b$ and $e_1$ are preferably also limited in order to simplify the deposition conditions and ensure a good mechanical strength is obtained. In contrast, giving the second film a larger minimum thickness has the effect of making the multilayer more effective as it significantly reduces the frequency with which short-circuits are observed.

Advantageously, for optical reasons, the ($SiO_x$) second barrier film is preferably the last film, in particular the last barrier film, or the last barrier film is separate from the second barrier film and has a refractive index between 1.4 and 1.7 and even 1.4 and 1.55.

In the present application when a "succession of films" or "successive films" is/are spoken of, or even when one film is said to be located on or under another film, reference is always being made to the process for manufacturing the electrode, in which the films are deposited one after the other on the transparent substrate. The first film is therefore the film that is closest to the substrate, all the "following" films being those located "on" the first film and "under" the films deposited afterwards.

The term "film" will in the present invention, unless otherwise specified, be used to refer to both a film made of a single material (monolayer) and to several films each made of a different material (multilayer).

In the present invention, unless otherwise indicated, the term "thickness" is understood to mean geometric thickness.

In the present invention, the expression "based on" in phrases of the form: a film based on oxide (based on nitride, respectively) of a (or more than one) given metal element(s), and the expression "-based" in phrases of the form: a metal-oxide-based (metal-nitride-based, respectively) film, will be understood to mean that the proportion by weight of the metal element or elements is at least 50% of the total weight of metal and preferably 70% of the total weight of metal.

According to the invention, unless otherwise specified, if a film (oxide or nitride) is said to be doped, the term "doped" will preferably be understood to mean that the metal dopant is present in an amount smaller than 10% of the total weight of metal in the film and even more preferably in an amount smaller than 6% or even 5% of the total weight of metal in the film.

In the present invention, in a film "essentially consisting" of or that "essentially consists" of an oxide (or a nitride) of a (or more than one) given metal element(s) and of optional expressly defined metal dopants, the proportion by weight of other metal elements (other than said elements and dopants) is preferably smaller than 10% of the total weight of metal and even more preferably smaller than or equal to 5%. In other words, the proportion by weight of said metal elements and metal dopants is preferably higher than 90% of the total weight of metal and even more preferably higher than or equal to 95% of the total weight of metal.

Furthermore, the term "metal" and the expressions "metal element" and "metal dopant" include silicon and boron and in addition all the metal elements of the periodic table (alkali metals, alkali-earth metals, transition metals, post-transition metals).

Naturally, according to the invention, a film "essentially consisting" of or that "essentially consists" of a given material may comprise other elements (impurities, etc.) provided that they do not notably modify the desired properties of the film.

According to the invention, if a film is said to be "made" of a material, the term "made" is understood to be synonymous with the expression "essentially consists".

According to the invention, the expression "thin film" is understood to mean a film having a (geometric) thickness smaller than 300 nm.

The films, especially the barrier films, are preferably obtained by magnetron sputtering.

The formulae given do not prejudge the actual stoichiometry of the films and whether they are doped. In particular the silicon nitride and/or silicon oxide may be doped, for example with aluminium.

The oxides and nitrides need not be stoichiometric (though they may be), hence the use in the formulae of the index "x", which is of course not necessarily the same for all the films.

For the silicon-nitride-based first barrier film, the silicon nitride may be nitrogen stoichiometric, nitrogen substoichiometric, or even nitrogen superstoichiometric. It will be understood that the silicon nitride may be doped and that it need not be stoichiometric.

By way of example, the silicon nitride may be doped with aluminium and/or another (or more than one other) metal dopant(s), especially with the aim of making it easier to deposit using a sputtering process.

The first barrier film has a refractive index (at 550 nm) of at least 1.9 and preferably between 1.9 and 2.1. The silicon nitride may contain oxygen (silicon oxynitride) in sufficiently small amounts for the refractive index of the film to remain in the aforementioned ranges.

The silicon-oxide-based second barrier film is advantageously a film that essentially consists of silicon oxide (i.e. silica). It will be understood that the second film may be doped and that it need not be stoichiometric. By way of example, the second film may be doped with aluminium and/or another (or more than one other) metal dopant(s), especially with the aim of making it easier to deposit using a sputtering process. The second barrier film has a refractive index (at 550 nm) between 1.4 and 1.7.

In the case of chemical vapour deposition (CVD), especially when the TCO is also deposited by CVD, the silica may be doped with boron or phosphorus atoms, thereby accelerating its deposition.

The second barrier film may even be doped with carbon or even nitrogen atoms in sufficiently small amounts for the refractive index of the film to remain in the aforementioned range. A silicon oxycarbide film, for example deposited by CVD, typically has a refractive index of 1.65. A silica film typically has an index of 1.48.

However, it is preferable for the second barrier film not to be nitrided and at the very least for it to be deposited in a reactive $N_2/O_2$ atmosphere.

The second barrier film may be the last film of the multilayer and therefore the film that makes contact with the liquid-crystal layer. Alternatively, at least one other thin film may be located on this second film having a barrier functionality and/or a last thin film that does not have a barrier functionality.

Thus, for the sake of (mechanical, etc.) protection, a last film having a thickness smaller than 15 nm, 10 nm or even smaller than or equal to 5 nm, for example based on titanium oxide or even essentially consisting of titanium oxide, may preferably be placed on the second barrier film or even on another barrier film placed directly on the second barrier film, the main function of this last film being mechanical protection—it has no barrier effect.

A film has no barrier effect, for example, when its dielectric constant is at least 10 or its breakdown voltage is lower than 4 MV/cm or it has a "destructive" breakdown mode—such as $TiO_2$. Mention may also be made, for example, of zirconia $ZrO_2$ and tantalum oxide $Ta_2O_5$. In the following this thin film will be called the protective film.

Preferably:
the total thickness $e_{tot}$ of the barrier films is smaller than 200 nm, smaller than or equal to 180 nm or even smaller than or equal to 120 nm; and
the total of the films thickness e' on the ITO is smaller than 200 nm, smaller than or equal to 180 nm or even smaller than or equal to 120 nm.

Advantageously, for an optimal barrier to short-circuits:
$e_2$ lies in a range extending from 30 to 100 nm, better still extending from 35 to 80 nm and even from 40 to 70 nm;
$e_b$ is preferably smaller than or equal to 120 nm and preferably $e_1$ lies in a range extending from 10 to 50 nm and better still extending from 10 to 40 nm; and
the second barrier film is preferably the last barrier film or even the penultimate barrier film.

In a first simple and effective preferred embodiment, $e_2$ lies in a range extending from 35 nm to 80 nm and $e_1$ lies in a range extending from 10 to 50 nm.

Preferably, in this first embodiment:
the second barrier film is preferably the last barrier film or even the penultimate barrier film;
the silicon-nitride-based first barrier film is deposited on and makes contact with the film based on ITO; and preferably, for its part, the second barrier film is deposited on and makes contact with the first barrier film.

Therefore, a multilayer is preferred with the following strict sequence: TCO (preferably ITO)/$SiN_x$/$SiO_x$(/protective film), with $e_1$ from 10 to 40 nm and $e_2$ from 40 to 70 nm.

However, in a second advantageous embodiment, the multilayer comprises a barrier film called the additional barrier film, this additional barrier film being based on mixed zinc tin oxide ($Sn_xZn_yO$ denoted SnZnO below) essentially consisting of oxide and tin (undoped or optionally doped), and having a thickness $e_{5'}$ of at least 5 nm and smaller than 50 nm and even more preferably of 10 to 30 nm, this additional barrier film, for optical adjustment purposes, being placed between the first and second barrier films and preferably in contact with the first and second barrier films. The additional barrier film has a refractive index of at least 1.9 and preferably between 1.9 and 2.1.

Insertion of this thin film of SnZnO is liable to limit the spatial extent of short-circuits. Specifically, during preliminary trials with thick (200 nm) films of $SiO_2$, $Si_3N_4$ and SnZnO on ITO, it was observed that:
- a thick film of $SiO_2$ was effective but led to (a small number of) short-circuits that extended over less than 1 cm, often a few mm at most;
- an SnZnO film was seven times less effective than a film of $SiO_2$ of the same thickness, but even though short-circuits were frequently observed they had a very limited size, smaller than a few mm; and
- $Si_3N_4$ was at least as effective as $SiO_2$ but led to a few short-circuits that were a few cm in diameter.

This may therefore cause the rare short-circuits that are liable to occur to be more acceptable (less visible).

The first barrier film is preferably located directly on the ITO film, for reasons of optical properties. Thus, a multilayer is preferred with the following strict sequence: TCO (preferably ITO)/$SiN_x$/(SnZnO)/$SiO_x$(/protective film).

In the SnZnO barrier film, the cumulative percentage of Sn+Zn by weight is preferably at least 85% of the total weight of metal and more preferably 90% or even 95%. The ratio of the number of Sn atoms to the number of Zn atoms is preferably between 20:80 and 80:20 and is in particular between 30:70 and 70:30.

The SnZnO barrier film may be doped for example with Sb or In. It preferably contains no indium.

In one embodiment, the multilayer may comprise, on the second barrier film, another barrier film called the over barrier film, this over barrier film being based on silicon nitride and having a thickness $e'_3$ of at least 5 nm and smaller than 50 nm and preferably of nm to 35 nm, the second barrier film preferably being the penultimate barrier film.

This other, over barrier film has a refractive index (at 550 nm) between 1.9 and 2.1. The silicon nitride may contain oxygen (silicon oxynitride) in sufficiently small amounts for the refractive index of the film to remain in the aforementioned range. Preferably, it is identical to the first barrier film.

Thus, a multilayer is preferred with the following strict sequence (n being greater than or equal to 1):
TCO (preferably ITO)/$SiN_x$/$SiO_x$/$SiN_x$(/protective film);
TCO (preferably ITO)/$SiN_x$/SnZnO/$SiO_x$$SiN_x$(/protective film); or even
TCO (preferably ITO)/[$SiN_x$/$SiO_x$]$_{n\ times}$/$SiN_x$/SnZnO/$SiO_x$/$SiN_x$(/protective film), where n is greater than or equal to 1.

In one embodiment, the multilayer may comprise, between the TCO film and the first barrier film, another barrier film called the under barrier film, this under barrier film being based on silicon oxide and having a thickness $e'_4$ of at least 5 nm and smaller than 50 nm and preferably of 15 nm to 35 nm.

Thus, a multilayer is preferred with the following strict sequence (n being greater than or equal to 1):
TCO (preferably ITO)/$SiO_x$/$SiN_x$/$SiO_x$(/protective film);
TCO (preferably ITO)/$SiO_x$/$SiN_x$/SnZnO/$SiO_x$ (/protective film);
or even TCO (preferably ITO)/[$SiN_x$/$SiO_x$]$_{n\ times}$/$SiN_x$/SnZnO/$SiO_x$(/protective film), where n is greater than or equal to 1.

In one embodiment, the multilayer comprises, between the TCO film and the first barrier film, in this order:
- a silicon-nitride-based third barrier film (based on $SiN_x$ and preferably $Si_3N_4$) having a thickness $e_3$ of at least 5 nm and smaller than 50 nm, optionally doped, preferably with aluminium and preferably essentially consisting of a silicon nitride, optionally doped, preferably with aluminium; and
- a silicon-oxide-based fourth barrier film (based on $SiO_x$ and preferably $SiO_2$) having a thickness $e_4$ of at least 5 nm and smaller than 50 nm, preferably essentially consisting of silicon oxide or silica that is undoped, or optionally doped, preferably with aluminium.

Naturally, it is preferable for the third barrier film to be made of an identical material to the first barrier film (produced from the same target, under the same deposition conditions). Naturally, it is preferable for the fourth barrier film to be made of an identical material to the second barrier film (produced from the same target, under the same deposition conditions).

The third barrier film has a refractive index of at least 1.9 and preferably between 1.9 and 2.1. As for the first film, the silicon nitride may contain oxygen (silicon oxynitride) in sufficiently small amounts for the refractive index of the film to remain in the aforementioned ranges.

The fourth barrier film has a refractive index between 1.4 and 1.7. It will be understood that the silica may be doped and that it need not be stoichiometric. By way of example, the silica may be doped with aluminium atoms or other atoms, with the aim of making it easier to deposit using a sputtering process. As for the second film, the fourth film may even be doped with carbon atoms or even nitrogen atoms, in sufficiently small amounts for the refractive index of the film to remain in the aforementioned range. However, it is preferable for the fourth film not to be nitrided and at the very least for it to be deposited in a reactive $N_2$/$O_2$ atmosphere. In the case of chemical vapour deposition (CVD), especially when the TCO (and also the second barrier film) are also deposited by CVD, the silica may be doped with boron or phosphorus atoms, thereby accelerating its deposition.

Increasing the number of interfaces enhances the barrier effect and preferably:
- $e_3$ lies in a range extending from 10 to 50 nm and preferably from 15 to 30 nm; and
- $e_4$ lies in a range extending from 10 to 50 nm and preferably from 15 to 30 nm,
- optionally $e_3 < e_4$, the second barrier film preferably being the last barrier film or even the last film.

For reasons of optical properties, the third barrier film is preferably located directly on the TCO film. Thus, a multilayer is preferred with the following strict sequence:
TCO (preferably ITO)/$SiN_x$/$SiO_x$/$SiN_x$/$SiO_x$ (/protective film);
TCO (preferably ITO)/$SiN_x$/$SiO_x$/$SiN_x$/SnZnO/$SiO_x$(/protective film); or TCO (preferably ITO)/SiN$_x$/Sn$_x$Zn$_y$O/SiO$_x$/SiN$_x$/SnZnO/ SiO$_x$(/protective film).

Optionally the multilayer comprises, between the TCO film and the third barrier film, at least once the following sequence: silicon-nitride-based barrier film having a thickness of at least 5 nm and smaller than 50 nm and preferably of 15 to 30 nm/silicon-oxide-based barrier film having a thickness of at least 5 nm and smaller than 50 nm (and preferably of 15 to 30 nm).

Thus, a multilayer is preferred with the following strict sequence (where n is greater than or equal to 1):

TCO (preferably ITO)/[SiN$_x$/SiO$_x$]$_{ntimes}$/SiN$_x$/SiO$_x$(/protective film); or TCO (preferably ITO)/[SiN$_x$/SiO$_x$]$_{ntimes}$/SiN$_x$/(SnZnO)/ SiO$_x$(/protective film).

A multilayer of neutralizing films may also be placed between the substrate and the TCO film. Such films (at least two films) allow the appearance of the glazing unit in reflection, especially its colour in reflection, to be adjusted. Once the electrically conductive support has been coated with the liquid-crystal layer (and even once it has been attached to another identical electrically conductive support), neutral i.e. slightly bluish/green colours will preferably be obtained, characterized by a*, b* colour coordinates near 0, negative a*, b* coordinates or a negative a* coordinate and a slightly positive b* coordinate, in preference to violet-pink/red (more positive a*) colours.

To obtain a neutral colour in reflection for the switchable glazing unit, it is preferable for a* and b* to lie in the interval (−8, +8) and better still between (−5, +5).

In a preferred embodiment, the multilayer comprises, in this order, on the main face, under the TCO film:

a silicon-nitride-based first underfilm (based on SiN$_x$ and preferably Si$_3$N$_4$) optionally doped, preferably with aluminium, having a thickness e$_y$ of 5 to 50 nm or preferably of 10 nm to 35 nm, preferably making (direct) contact with the main face and preferably essentially consisting of a silicon nitride, optionally doped, preferably with aluminium; and a silicon-oxide-based second underfilm (based on SiO$_x$ and preferably SiO$_2$) having a thickness e$_z$ of 10 to nm and preferably of 20 nm to 50 nm, preferably essentially consisting of a silicon oxide, this underfilm being undoped or optionally doped, preferably with aluminium, and preferably making contact with the TCO film.

The best adjustment is obtained with an e$_y$ of between 10 and 35 nm, an e$_z$ of between 20 and 50 nm, an e$_1$ of between 10 and 40 nm and when e$_2$ is between 40 and 70 nm.

For the silicon nitride first underfilm (made of silicon nitride), the silicon nitride may be nitrogen stoichiometric, nitrogen substoichiometric, or even nitrogen superstoichiometric. By way of example, the silicon nitride may be doped with aluminium or other dopants, with the aim of making it easier to deposit using sputtering processes. The first underfilm has a refractive index (at 550 nm) of at least 1.9 and preferably between 1.9 and 2.1. The silicon nitride may contain oxygen (silicon oxynitride) in sufficiently small amounts for the refractive index of the first under film to remain in the aforementioned ranges.

The silicon-oxide-based second underfilm is advantageously a film essentially consisting of silicon oxide (in other words silica). It will be understood that the silica may be doped and that it need not be stoichiometric. By way of example, the silica may be doped with aluminium or other dopants, with the aim of making it easier to deposit using sputtering processes. The second underfilm may even be doped with carbon atoms or even nitrogen atoms, in sufficiently small amounts for the refractive index of the second underfilm to remain in the aforementioned range. However, it is preferable for this second underfilm not to be nitrided and at the very least for it to be deposited in a reactive N$_2$/O$_2$ atmosphere. The second underfilm has a refractive index (at 550 nm) between 1.4 and 1.7.

In the case of chemical vapour deposition (CVD), especially when the TCO is also deposited by CVD, the second underfilm may be doped with boron or phosphorus atoms, thereby accelerating its deposition. The silicon-oxide-based second underfilm may be the last film under the TCO. Alternatively, at least one other thin film may be deposited on this second film.

Preferably silicon oxide films that are all made of the same material and silicon nitride films that are all made of the same material will be chosen for the multilayer.

A film called the smoothing film, this smoothing film being based on mixed zinc tin oxide and having a thickness e$_f$ of at least 5 nm and smaller than 50 nm and preferably of 10 to 30 nm, may be placed intermediate between the first and second underfilms, the (main) function of this smoothing film being to smooth, by way of its amorphous nature. The thicknesses e$_y$ and e$_z$ remain unchanged.

In the SnZnO smoothing film, the cumulative percentage of Sn+Zn by weight is at least 85% of the total weight of metal and preferably 90% or even 95%. The ratio of the number of Sn atoms to the number of Zn atoms is preferably between 20:80 and 80:20 and is in particular between 30:70 and 70:30. The SnZnO smoothing film may be doped for example with Sb or even In. It preferably contains no indium.

In one embodiment combining effective protection from short-circuits and a neutral colour (or slight green or blue tint) in reflection, the multilayer comprises:

a silicon-nitride-based first underfilm having a thickness e$_y$ of 5 to 50 nm and preferably of 10 nm to 40 nm, preferably directly on the main face;

a silicon-oxide-based second underfilm having a thickness e$_z$ of 10 to 50 nm and preferably e$_y$ is from 20 to 50 nm, optionally directly on the first underfilm;

the TCO film is preferably directly on the second underfilm;

the first barrier film is directly on the TCO film with e$_1$ lying in a range extending from 10 to 40 nm; and the second barrier film, with e$_2$ lying in a range extending from 35 nm to 80 nm and preferably from 40 to nm, which is the last barrier film, preferably directly on the first barrier film.

The various preferred embodiments described above may of course be combined together. All the possible combinations are not explicitly described in the present text in order not to increase its length unnecessarily. A few examples of particularly preferred multilayers (excluding details of the optional doping of the barrier films and underfilms) located directly on (preferably mineral) glass are given below:

SiN$_x$/SiO$_x$/TCO(preferably ITO)/SiN$_x$/(SnZnO)/SiO$_x$;
SiN$_x$/SiO$_x$/TCO(preferably ITO)/SiN$_x$/SnZnO/SiO$_x$/ (TiO$_x$ type protection); or
SiN$_x$/(SnZnO)/SiO$_x$/TCO(preferably ITO)/SiN$_x$/(SnZnO)/SiO$_x$/(TiO$_x$ type protection film).

As was indicated above, each barrier film according to the invention, whether based on silicon nitride or on silicon oxide, may be doped with aluminium. The percentage by weight of aluminium in the aluminium-doped silicon nitride is preferably no more than 20% or 15% or even 10% of the total weight of metal, or even of the combined weight of silicon and aluminium. The percentage by weight of aluminium in the aluminium-doped silicon oxide is preferably no more than 20% or 15% or even 10% of the total weight of metal, or of the combined weight of silicon and aluminium.

The substrate may be flat or curved and may furthermore be rigid, flexible or semi-flexible.

The main faces thereof may be rectangular, square or even any other shape (round, oval, polygonal, etc.). This substrate may be large in size, for example being larger than 0.02 m² in area, or even larger than 0.5 m² or 1 m² in area.

The transparent substrate may preferably have a luminous transmission $T_L$ of 70% or more, preferably 80% or more or even 90% or more. The substrate is preferably transparent and colourless. The substrate may be a glazing pane, made of mineral or organic glass, and is preferably transparent and colourless.

It may then be a clear or extra-clear mineral glass. Clear glass typically has an iron oxide content by weight of about 0.05 to 0.2%, whereas extra-clear glass generally contains about 0.005 to 0.03% iron oxide.

The substrate, especially if made of mineral glass, may however be coloured, for example having a blue, green, grey or bronze colour.

Specifically, the for example coloured or tinted transparent substrate may preferably have a luminous transmission $T_L$ of 10% or more—for example in a context where the medium on the side of the exterior face of the substrate (opposite the face with the electrode) is brightly illuminated—and preferably of 40% or more.

The mineral glass substrate is preferably a soda-lime-silica glass substrate but it may also be made of a borosilicate or alumino-borosilicate glass. The mineral glass substrate generally has a thickness in a range extending from 0.5 mm to 19 mm, preferably from 0.7 to 9 mm, especially from 2 to 8 mm, or even from 4 to 6 mm. The same applies, depending on the circumstances, to the other glass panes of the multiple glazing unit.

The mineral glass substrate is preferably a float glass substrate, that is to say capable of being obtained by a process consisting in casting the molten glass onto a bath of molten tin ("float" bath). In this case, the multilayer may be deposited either on the "tin" side or on the "atmosphere" side of the substrate. The terms "atmosphere side" and "tin side" are understood to mean those faces of the substrate that have been in contact with the atmosphere in the float bath and in contact with the molten tin, respectively. The tin side contains a small amount of superficial tin that has diffused into the glass structure.

Preferably, the substrate equipped with the multilayer according to the invention is not thermally tempered.

The substrate may be made of a plastic. The substrate may especially be a film based on polyethylene terephthalate (PET), polyethylene naphthalate (PEN), polycarbonate, polyurethane, polymethyl methacrylate, polyamide, polyimide, a fluoropolymer such as ethylene tetrafluoroethylene (ETFE), polyvinylidene fluoride (PVDF), polychlorotrifluoroethylene (PCTFE), ethylene chlorotrifluoroethylene (ECTFE) and fluorinated ethylene-propylene copolymers (FEP).

As a variant, it may be a lamination interlayer for bonding to a rigid or flexible substrate. This polymer lamination interlayer may especially be a film based on polyvinyl butyral (PVB), ethylene vinyl acetate (EVA), polyethylene (PE), polyvinyl chloride (PVC), a thermoplastic urethane, polyurethane (PU), an ionomer, a polyolefin-based adhesive, a thermoplastic silicone, or a multi-component or single-component resin that is thermally curable (epoxy or PU) or UV-curable (epoxy, acrylic resin).

The following structure may even be envisaged:
mineral glass/thermoplastic lamination interlayer/electrically conductive support (preferably PET substrate/multilayer)/liquid-crystal layer.

The $T_L$ of the electrically conductive support (substrate/multilayer), in particular colourless (tinted), is preferably at least 70% or more and preferably 80% or more.

The electrically conductive support according to the invention is preferably obtained using a process involving a number of steps. The films of the multilayer are deposited on the substrate, which thus generally takes the form of a large 3.2×6 m² sheet of (mineral) glass, or directly on the glass ribbon during or just after the float process, then the substrate is cut to the final size of the glazing unit. After the edges have been smoothed, the liquid-crystal-comprising switchable glazing unit is then manufactured, as described below.

The various films of the multilayer may be deposited on the substrate using any type of thin-film deposition process. This may for example be a (liquid or solid) pyrolysis process, a chemical vapour deposition (CVD) process, especially a plasma enhanced chemical vapour deposition (PECVD) process and optionally an atmospheric-pressure plasma enhanced chemical vapour deposition process (APPECVD), evaporation or even a sol-gel process.

Preferably, the films of the multilayer, at least the barrier films, are obtained by sputtering, especially magnetron sputtering. In this process, a plasma is created in a high vacuum close to a target comprising the chemical elements to be deposited. The active species of the plasma, by bombarding the target, tear off said elements, which are deposited on the substrate forming the desired thin film. This process is called a "reactive" process when the film consists of a material resulting from a chemical reaction between the elements torn off from the target and the gas contained in the plasma. The major advantage of this process lies in the fact that it is possible to deposit a very complex film multilayer on a given line by running the substrate in succession beneath various targets, generally in one and the same device.

The thickness of TCO film is preferably tailored to give it an ("intrinsic") sheet resistance of 150Ω/□ or less and preferably 120Ω/□ or less.

The TCO film is supplied with electrical power via leads, preferably metal leads (based on silver, copper, etc.) preferably taking the form of at least two (metal) strips spaced apart and on/along two opposite edges of the TCO film, whether the general shape of the TCO film is such that it has corners or is round.

The transparent electrically conductive oxide film is preferably an indium tin oxide (ITO) film. Other films may be used, including thin films:
  based on indium zinc oxide (called "IZO") or indium gallium zinc oxide (IGZO);
  based on doped zinc oxide preferably doped with gallium or aluminium (GZO or AZO), based on niobium-doped titanium oxide, based on cadmium or zinc stannate; or
  based on tin oxide doped with fluorine ($SnO_2$:F), based on tin oxide doped with antimony.

In the case of aluminium-doped zinc oxide, the doping level (i.e. the ratio of the aluminium oxide weight to the total weight) is preferably lower than 3%. In the case of gallium, the doping level may be higher, typically lying in a range extending from 5 to 6%.

In the case of ITO, the atomic percentage of Sn preferably lies in a range extending from 5 to 70%, especially from 10 to 60%.

For films based on fluorine-doped tin oxide, the atomic percentage of fluorine is preferably at most 5% and generally from 1 to 2%.

ITO is particularly preferred or even IZO, AZO, GZO or IGZO. Easily deposited using a sputtering process, especially a magnetron sputtering process, these films are noteworthy in that they are smoother than those deposited by CVD.

One of the advantages of fluorine-doped tin oxide is, however, that it may be easily deposited by chemical vapour deposition (CVD) and may be implemented on a line producing flat glass using the float process. In one embodiment, the films of the multilayer are obtained by chemical vapour deposition, directly on the production line of the float-glass pane. The deposition is carried out by sputtering from precursors through nozzles, onto the hot glass ribbon. The various films may be deposited at various points on the line: in the float chamber, between the float chamber and the lehr or in the lehr. The precursors are generally organometallic molecules or molecules of the halide type.

By way of example mention may be made, for fluorine-doped tin oxide, of tin tetrachloride, monobutyltin trichloride (MBTC), trifluoroacetic acid or hydrofluoric acid. Silicon oxide may be obtained using silane, tetraethoxysilane (TEOS) or indeed hexamethyldisiloxane (HMDSO), optionally using an accelerator such as triethylphosphate.

The refractive index of the transparent electrically conductive oxide film lies in a range extending from 1.7 to 2.5.

The invention also relates to an electrically conductive support according to the invention with a liquid-crystal layer having a micron-sized thickness.

All the liquid-crystal systems known under the terms NCAP (nematic curvilinearly aligned phases), PDLC (polymer dispersed liquid crystal), CLC (cholesteric liquid crystal) and NPD-LCD (non-homogenous polymer dispersed liquid crystal display) may be used.

Use may be made of multistable liquid crystals and in particular bistable smectic liquid crystals, for example as explained in detail in patent EP 2 256 545, which crystals switch under the application of an alternating electric field in pulsed form and remain in the switched state until the application of a new pulse.

It is also possible to use, for example, gels based on cholesteric liquid crystals that contain a small amount of crosslinked polymer, such as those described in patent WO 92/19695. More broadly, PSCT (polymer stabilized cholesteric texture) systems may therefore be chosen.

Lastly, the invention relates to a glazing unit having liquid-crystal-mediated variable scattering properties, comprising:
  the electrically conductive support such as described above;
  on said support, a layer comprising liquid crystals dispersed in (micro)droplets in a polymer, the liquid-crystal layer alternating reversibly between a transparent state and a translucent state, typically through application of an alternating (sinusoidal, pulsed, etc.) electric field, this layer being 5 to 60 µm in thickness and preferably 8 µm and smaller than 40 µm, i.e. between 5 and 40 µm, in thickness, and containing (transparent) spacers; and
  another electrically conductive support, preferably such as described above, comprising another substrate equipped with another multilayer containing at least one other electrode, said multilayer making contact with the liquid-crystal layer,
  the substrate of the (first) support and the other substrate, of the second support, being held together on the border of their facing faces by a seal that is preferably organic.

The following structures may also be envisaged:
  (first) electrically conductive support according to the invention with a mineral glass substrate/liquid-crystal layer/other transparent multilayer/other mineral glass support; and
  glass/interlayer/PET substrate/multilayer according to the invention/liquid-crystal layer/other transparent multilayer/other PET support/interlayer/mineral glass.

Naturally, the liquid crystals may extend over substantially the entire area of the glazing unit (outside of a margin), or over (at least) one restricted zone or optionally over a number of zones.

The glazing unit having liquid-crystal-mediated variable scattering properties such as described above may be used as a glazing unit in vehicles or buildings.

The glazing unit having liquid-crystal-mediated variable scattering properties according to the invention may especially be used:
  as an internal partition (between two rooms or in a space) in a building or in a terrestrial, aerial or nautical means of transportation (between two compartments, in a taxi, etc.);
  as a glazed door, as a window, ceiling or as tiling (for a floor or ceiling);
  as a rear-view mirror of a vehicle, as a side window or roof of a terrestrial, aerial or nautical means of transportation;
  as a projector screen; or
  as a shop front or a shop window especially a counter window.

Naturally, the glazing unit according to the invention may form all or part of a partition or any other sort of window (transom, etc.).

Decreasing the thickness of the liquid-crystal layer (and therefore the amount of encapsulated active material) below 15 µm allows material costs to be reduced.

Moreover, the spacers may preferably be made of a transparent plastic material. The spacers (roughly) define the thickness of the liquid-crystal layer. For example, spacers made of polymethyl methacrylate (PMMA) are preferred.

The spacers are preferably made of a material having an optical index (substantially) equal to the optical index of the (polymer matrix of the) liquid-crystal layer. The spacers for example take the form of beads.

Regarding the manufacture of the glazing unit the reader may refer to document WO 2012/028823, which discloses a liquid-crystal-comprising multiple glazing unit, comprising:
  first and second flat float-glass sheets held together on the border of their internal faces by an epoxy seal;
  on the internal faces of the first and second glass sheets, first and second electrodes taking the form of transparent electrically conductive ITO films connected to a power supply; and
  between the first and second electrodes a PDLC (polymer dispersed liquid crystal) layer containing liquid crystals, such as the compound 4-((4-ethyl-2,6-difluorophenyl)-ethinyl)-4'-propylbiphenyl or 2-fluoro-4,4'-bis(trans-4-propylcyclohexyl)-biphenyl, for example sold by Merck under the reference MDA-00-3506, dispersed in microdroplets in a polymer and containing transparent spacers, the PDLC layer alternating reversibly between a transparent state and a translucent state through application of an alternating electric field.

The liquid-crystal coating is produced using what is called a drip filling process.

The material that will form the adhesive seal is likewise applied as a bead in unpolymerized form, directly along the edge of the glass sheet, before or after the liquid-crystal film has been deposited with the unpolymerized matrix.

Next, a rolling operation, or as a variant a pressing operation, is carried out.

The material of the seal and of the matrix is then polymerized.

Other details and features of the invention will become apparent from the following detailed description given with regard to the appended FIGURE, FIG. 1, which shows a schematic cross-sectional view of a glazing unit having liquid-crystal-mediated variable scattering properties with an electrically conductive support according to the invention.

The example embodiment shown in FIG. 1 shows the design of the switchable liquid-crystal-comprising glazing unit according to the invention.

Thin-film multilayers 3, 4 having external surfaces 31, 41 and containing electrodes made of indium tin oxide (ITO) are deposited on the internal faces 11, 21 of two float-glass (or as a variant on plastic such as PET) sheets 1 and 1'.

More precisely the multilayer comprises at least two thin films acting as barriers to short-circuits, which films are deposited on the ITO film, as will be described below.

Preferably, to ensure the colour neutrality of the switchable glazing unit, the multilayer comprises at least two thin dielectric underfilms under the ITO film, as will be detailed below.

A liquid-crystal layer 5 is located between the multilayers 3 and 4. More precisely, the liquid-crystal layer 5 is for example a PDLC layer and contains liquid crystals in the form of microdroplets dispersed in a polymer matrix. The layer 5 also contains spherical transparent polymer spacers. The layer 5 is for example 20 μm in thickness and may typically be 5 to 60 μm in thickness.

Liquid crystals such as the compound 4-((4-ethyl-2,6-difluorophenyl)-ethinyl)-4'-propylbiphenyl or 2-fluoro-4,4'-bis(trans-4-propylcyclohexyl)-biphenyl, for example sold by Merck under the reference MDA-00-3506, may be used.

The edge of the liquid-crystal layer 5 is encircled by an adhesive seal 7 made of a cured polymer that serves to join the electrode-bearing glass sheets 1, 1' both firmly and permanently.

In the "OFF" state, i.e. before an electrical voltage has been applied, this liquid-crystal-comprising glazing unit 100 is translucent, i.e. it transmits light but is not transparent. Once a sinusoidal voltage has been applied between the two electrodes, the layer 5 passes to the transparent state, i.e. the state in which sight is no longer obstructed.

Naturally, for certain applications, it may alternatively be desired for the electrically controllable glazing unit to be tinted in its "ON" state. To do this, one or the substrates are tinted or a tinted element, for example a tinted plastic film or a tinted counter pane is laminated with one of the mineral glass substrates (by PVB, EVA, etc.), or a tinted interlayer, is added.

EXAMPLES

In example Ex1, the following multilayer: ITO (60 nm)/$Si_3N_4$ (15 nm)/$SiO_2$ (60 nm) was produced on a 4 mm-thick sample of soda-lime-silica glass (Planilux glass from SGGF or alternatively Diamant glass).

In example Ex2, the following multilayer: $Si_3N_4$ (15 nm)/$SiO_2$ (30 nm)/ITO (60 nm)/$Si_3N_4$ (35 nm)/$SiO_2$ (48 nm) was produced on a 4 mm-thick sample of soda-lime-silica glass (Planilux glass from SGGF).

In example Ex3, the following multilayer: $SiO_2$ (40 nm)/ITO (120 nm)/$Si_3N_4$ (15 nm)/$SiO_2$ (60 nm) was produced on a 4 mm-thick sample of soda-lime-silica glass (Planilux glass from SGGF).

In example Ex4, the following multilayer: $Si_3N_4$ (15 nm)/$SiO_2$ (40 nm)/ITO (120 nm)/$Si_3N_4$ (15 nm)/$SiO_2$ (60 nm) was produced on a 4 mm-thick sample of soda-lime-silica glass (Planilux glass from SGGF).

In example Ex5, the following multilayer: $Si_3N_4$ (25 nm)/$SiO_2$ (40 nm)/ITO (60 nm)/$Si_3N_4$ (35 nm)/$SiO_2$ (60 nm) was produced on a 4 mm-thick sample of soda-lime-silica glass (Planilux glass from SGGF).

More precisely, the silicon nitride film and the silica film contained aluminium.

The films were deposited by sputtering (magnetron sputtering). The deposition conditions for each of the films were the following:

films based on $Si_3N_4$:Al were deposited by reactive sputtering using a silicon and aluminium target in an argon/nitrogen atmosphere;

films based on $SiO_2$:Al were deposited by reactive sputtering using a silicon and aluminium target in an argon/oxygen atmosphere; and films based on ITO were deposited using a ceramic target, in an argon/oxygen atmosphere as a variant.

The deposition conditions are collated in Table 1 below:

TABLE 1

| Film | Target employed | Deposition pressure | Gas | Refractive index at 550 nm |
|---|---|---|---|---|
| $Si_3N_4$:Al | 92:8 wt % Si:Al | $2 \times 10^{-3}$ mbar | $N_2/(Ar + N_2)$ of 40% | 2.0 |
| $SiO_2$:Al | 92:8 wt % Si:Al | $2 \times 10^{-3}$ mbar | $O_2/(Ar + O_2)$ of 45% | 1.5 |
| ITO | 90 wt % In oxide and 10 wt % Sn oxide | $2.5 \times 10^{-3}$ mbar | $O_2 < 4\%$ and Ar > 96% | 2 |

The $T_L$ and sheet resistance of the electrically conductive supports Ex1 to Ex4 are given in Table 2 below:

TABLE 2

| Examples | $R_c$ (Ω/□) | $T_L$ (%) |
|---|---|---|
| Ex1 | 91 | 88.0 |
| Ex2 | 140 | 88.8 |
| Ex3 | 117 | 87.0 |
| Ex4 | 105 | 87.3 |
| Ex5 | 105 | 88.0 |

The short-circuit yield Rcc, which is the percentage of 1 $m^2$ of liquid-crystal-comprising glazing unit free from short-circuits after switching at the indicated voltage, was measured for the glazing units having liquid-crystal-mediated variable scattering properties of examples Ex1 to Ex4.

In the series of tests carried out, Rcc was near 100% at 30 V and greater than 70% at 90 V compared to 40% and 0% for a glass sample coated with an ITO film, and compared to 70% and 0% when a 60 nm-thick $SiO_2$ film was applied.

$T_L$ and other optical properties were also measured for the liquid-crystal-comprising glazing units (LC glazing or LCG) in the ON state, the measured values being collated in Table 3 below:

TABLE 3

The LC glazing units of Ex1 and Ex2 had a neutral colour in reflection: a* and b* were in the −8, +8 interval.

| Example | $T_L$ | $L^*_T$ | $a^*_T$ | $b^*_T$ | $R_L$ | $L^*_R$ | $a^*_R$ | $b^*_R$ | abs |
|---|---|---|---|---|---|---|---|---|---|
| LCG of Ex1 | 73.9 | 88.9 | −1.3 | 0.5 | 20.2 | 52.0 | −3.7 | 6.2 | 6.0 |
| LCG of Ex2 | 83.7 | 93.3 | −3.5 | 6.3 | 9.5 | 36.9 | 2.9 | −5.0 | 6.8 |
| LCG of Ex3 | 81.2 | 92.2 | −4.2 | 15.2 | 10.4 | 38.5 | 3.7 | −21.5 | 8.4 |
| LCG of Ex4 | 81.9 | 92.5 | −4.9 | 12.3 | 9.7 | 37.3 | 6.8 | −14.3 | 9.7 |

The LC glazing unit of Ex4 was grey-blue (neutral but bright colour) and the LC glazing unit of Ex1 was green.

As a variant, a third 20 nm-thick barrier film made of zinc tin oxide and produced from a metal zinc/tin target in an oxidizing atmosphere is placed intermediate between the first and second barrier films. The deposition conditions are given in Table 4 below:

TABLE 4

| Film | Target employed | Deposition pressure | Gas | Refractive index at 550 nm |
|---|---|---|---|---|
| SnZnO | 64:36 wt % Sn:Zn | $3.5 \times 10^{-3}$ mbar | $O_2/(Ar + O_2)$ of 39% | 2 |

As a (alternative or cumulative) variant, a 5 nm-thick protective film made of titanium oxide produced from a metal target in an oxidizing atmosphere is added onto the second barrier film. This film has the effect of improving mechanical properties. The deposition conditions are detailed in Table 5 below:

TABLE 5

| Film | Target employed | Deposition pressure | Gas | Refractive index at 550 nm |
|---|---|---|---|---|
| $TiO_2$ | Ti | $2.5 \times 10^{-3}$ mbar | $O_2/(Ar + O_2)$ of 10% | 2.5 |

Another TCO could be used, preferably deposited by sputtering, with the same barrier films and preferably neutralizing films as used above.

For optical reasons, it is preferable for the last barrier film to be based on silicon oxide and for it to be the second barrier film.

The invention claimed is:

1. An electrically conductive support for a glazing unit having liquid-crystal-mediated variable scattering properties, the electrically conductive support comprising a first transparent substrate having a main face comprising a multilayer of thin films, the multilayer of thin films having an order extending outwardly from the main face as follows:
   an electrode comprising a TCO film based on transparent electrically conductive oxide;
   a silicon-nitride-based first barrier film having a thickness $e_1$ of at least 5 nm; and
   a silicon-oxide-based second barrier film having a thickness $e_2$ of at least 30 nm,
      wherein at least one of the thickness $e_1$ is smaller than or equal to $e_2$ and $e_1$ is smaller than 80 nm, and
   a cumulative thickness $e_b$ of the first and second barrier films is larger than or equal to 50 nm and smaller than 150 nm.

2. The electrically conductive support according to claim 1, wherein $e_2$ ranges from 30 to 100 nm, and $e_b$ is smaller than or equal to 120 nm.

3. The electrically conductive support according to claim 1, wherein $e_2$ ranges from 35 nm to 80 nm and $e_1$ ranges from 10 nm to 50 nm.

4. The electrically conductive support according to claim 1, wherein the multilayer comprises, between the first and second barrier films, a barrier film called an additional barrier film, the additional barrier film being based on zinc tin oxide and having a thickness $e_{5'}$ of at least 5 nm and smaller than 50 nm.

5. The electrically conductive support according to claim 1, further comprising, on the second barrier film, another barrier film called an over barrier film, the over barrier film being based on silicon nitride and having a thickness $e'_3$ of at least 5 nm and smaller than 50 nm.

6. The electrically conductive support according to claim 1, wherein the multilayer comprises, between the TCO film and the first barrier film, another barrier film called an under barrier film, the under barrier film being based on silicon oxide and having a thickness $e'_4$ of at least 5 nm and smaller than 50 nm.

7. The electrically conductive support according to claim 1, wherein the multilayer comprises, between the TCO film and the first barrier film, additional films in the following order:
   a silicon-nitride-based third barrier film having a thickness $e_3$ of at least 5 nm and smaller than 50 nm; and
   a silicon-oxide-based fourth barrier film having a thickness $e_4$ of at least 5 nm and smaller than 50 nm.

8. The electrically conductive support according to claim 1, wherein the multilayer comprises, in this order, on the main face, under the TCO film:
   a silicon-nitride-based first underfilm deposited directed on the main face and having a thickness $e_y$ of 5 to 50 nm; and
   a silicon-oxide-based second underfilm having a thickness $e_z$ of 10 to 50 nm.

9. The electrically conductive support according to claim 8, wherein $e_y$ is between 10 and 35 nm, $e_z$ is between 20 and 50 nm, $e_1$ is between 10 and 40 nm, and $e_2$ is between 40 and 70 nm.

10. The electrically conductive support according to claim 8, wherein the multilayer comprises, between the first underfilm and the second underfilm a film called a smoothing film, the smoothing film being based on mixed zinc tin oxide and having a thickness $e_f$ of at least 5 nm and smaller than 50 nm.

11. The electrically conductive support according to claim 1, further comprising a layer comprising liquid crystals directly on the second barrier film.

12. The electrically conductive support according to claim 1, wherein the first transparent substrate is a sheet of mineral glass.

13. The electrically conductive support according to claim 1, wherein the TCO film is chosen from a film based on zinc oxide that is doped with aluminium and/or gallium, a film based on tin oxide doped with fluorine and/or antimony, a film based on indium tin oxide, a film based on zinc tin oxide, and a film based on indium zinc tin oxide.

14. The electrically conductive support according claim 13, wherein the TCO film is a film based on indium tin oxide.

15. A glazing unit having liquid-crystal-mediated variable scattering properties, comprising:
   the electrically conductive support according to claim 1;
   on said support, a layer comprising liquid crystals; and
   a second electrically conductive support also according to claim 1, said second electrically conductive support comprising a second transparent substrate comprising a second multilayer containing at least one other electrode, said second multilayer being in contact with the liquid-crystal layer.

* * * * *